(12) United States Patent
Behler

(10) Patent No.: US 8,715,457 B2
(45) Date of Patent: May 6, 2014

(54) METHOD FOR DETACHING AND REMOVING A SEMICONDUCTOR CHIP FROM A FOIL

(75) Inventor: Stefan Behler, Steinhausen (CH)

(73) Assignee: Esec AG, Cham (CH)

( * ) Notice: Subject to any disclaimer, the term of this patent is extended or adjusted under 35 U.S.C. 154(b) by 166 days.

(21) Appl. No.: 13/128,864

(22) PCT Filed: Nov. 3, 2009

(86) PCT No.: PCT/EP2009/064535
§ 371 (c)(1),
(2), (4) Date: May 11, 2011

(87) PCT Pub. No.: WO2010/054957
PCT Pub. Date: May 20, 2010

(65) Prior Publication Data
US 2011/0214819 A1      Sep. 8, 2011

Related U.S. Application Data

(60) Provisional application No. 61/113,761, filed on Nov. 12, 2008.

(51) Int. Cl.
*B32B 38/10* (2006.01)
(52) U.S. Cl.
USPC ........... 156/707; 156/716; 156/758; 156/765; 156/932; 156/943; 438/464
(58) Field of Classification Search
USPC .......... 438/464; 156/932, 943, 707, 716, 758, 156/765
See application file for complete search history.

(56) References Cited

U.S. PATENT DOCUMENTS

| | | | |
|---|---|---|---|
| 4,921,564 A | 5/1990 | Moore | |
| 6,555,418 B2 * | 4/2003 | Kurosawa et al. | 438/118 |
| 6,561,743 B1 | 5/2003 | Nakatsu | |
| 7,238,593 B2 | 7/2007 | Medding et al. | |
| 7,240,422 B2 * | 7/2007 | Cheung et al. | 29/762 |
| 7,265,035 B2 | 9/2007 | Honma et al. | |
| 8,133,823 B2 * | 3/2012 | Behler et al. | 438/800 |
| 8,142,611 B2 * | 3/2012 | Shibata et al. | 156/716 |
| 8,499,813 B2 * | 8/2013 | Chien et al. | 156/765 |

(Continued)

FOREIGN PATENT DOCUMENTS

| | | |
|---|---|---|
| EP | 1 424 722 | 6/2004 |
| EP | 1 596 422 | 11/2005 |

(Continued)

OTHER PUBLICATIONS

International Preliminary Report on Patentability for International Application No. PCT/EP2009/064535, dated May 17, 2011.

*Primary Examiner* — Mark A Osele
(74) *Attorney, Agent, or Firm* — Nixon Peabody LLP

(57) ABSTRACT

The detachment and removal of a semiconductor chip from a foil occurs in accordance with the invention in three phases. In the first phase there is a partial detachment of the semiconductor chip from the foil with mechanical means, but without the participation of a chip gripper. In the second phase the semiconductor chip is further detached from the foil, with the semiconductor chip being held by the chip gripper. In the third phase the chip gripper is lifted and moved away.

4 Claims, 7 Drawing Sheets

(56) References Cited

U.S. PATENT DOCUMENTS

Figure 1A:
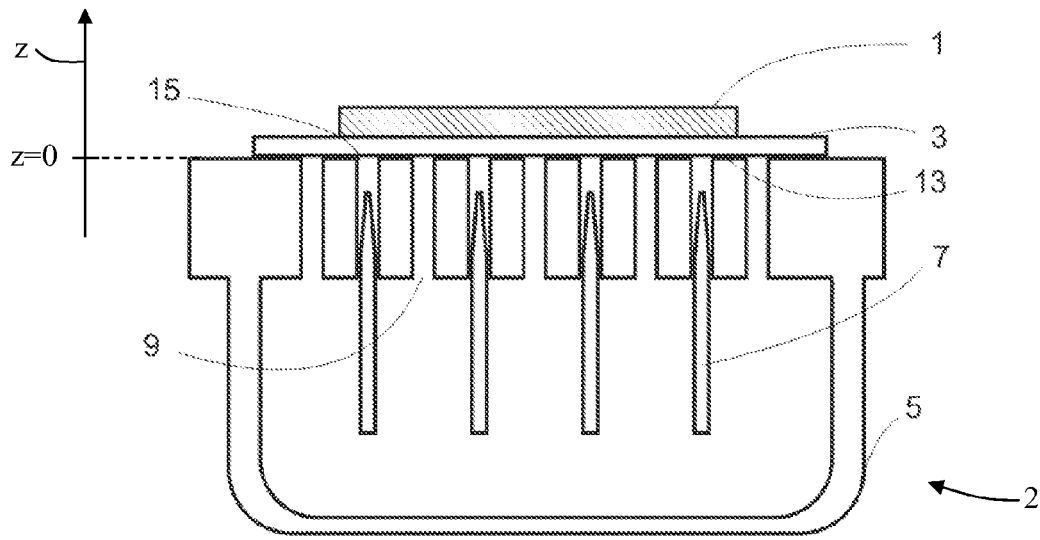

| | | |
|---|---|---|
| 2002/0129899 A1 | 9/2002 | Mimata et al. |
| 2003/0101576 A1 | 6/2003 | Hartmann |
| 2004/0038498 A1* | 2/2004 | Ozono et al. ............ 438/464 |
| 2004/0105750 A1 | 6/2004 | Bolliger et al. |
| 2005/0059205 A1 | 3/2005 | Maki et al. |
| 2006/0237142 A1 | 10/2006 | Park et al. |
| 2007/0158024 A1* | 7/2007 | Addison et al. ........... 156/344 |
| 2007/0277929 A1 | 12/2007 | Trinks et al. |
| 2008/0086874 A1 | 4/2008 | Cheung et al. |
| 2008/0173407 A1 | 7/2008 | Min et al. |
| 2012/0312482 A1* | 12/2012 | Konno et al. .............. 156/758 |

FOREIGN PATENT DOCUMENTS

| | | |
|---|---|---|
| JP | 5-283506 | 10/1993 |
| JP | 2006-5030 | 1/2006 |
| JP | 2008-109119 | 5/2008 |
| WO | 2005/117072 | 12/2005 |
| WO | 2008/004270 | 1/2008 |

* cited by examiner

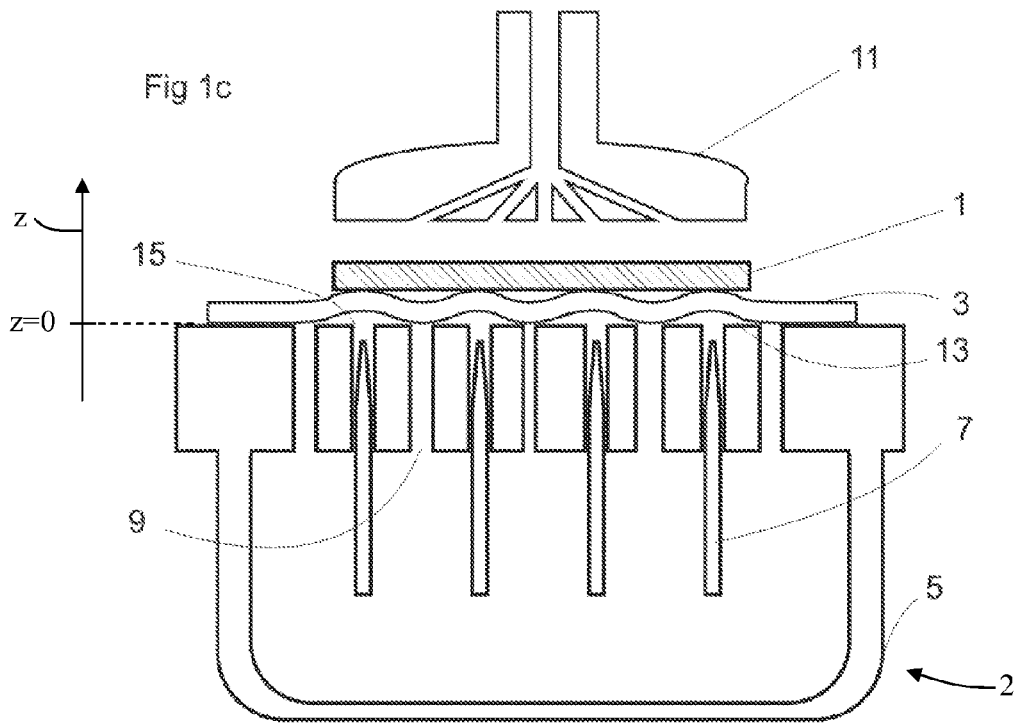
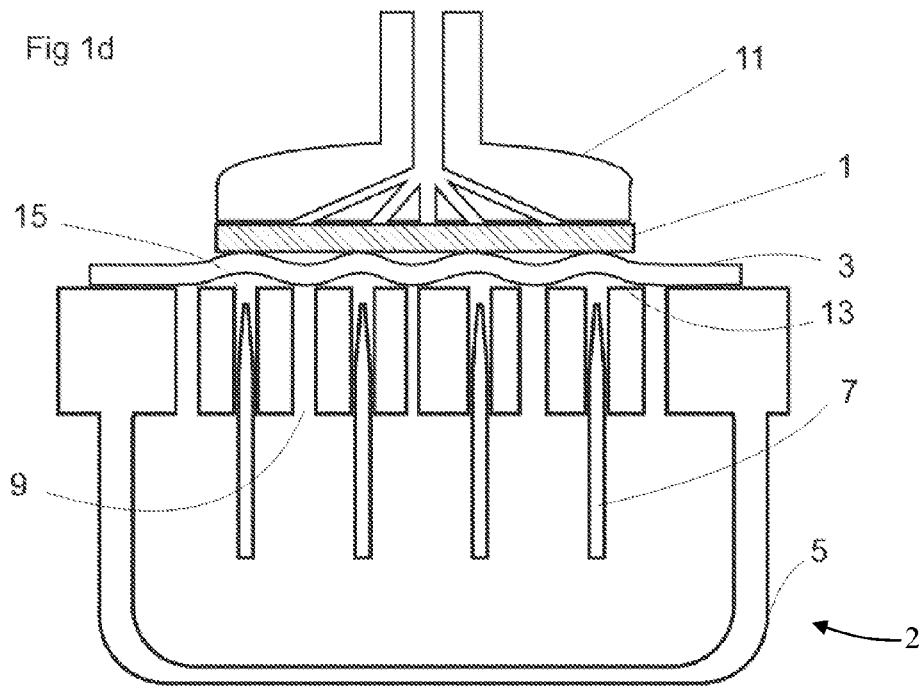

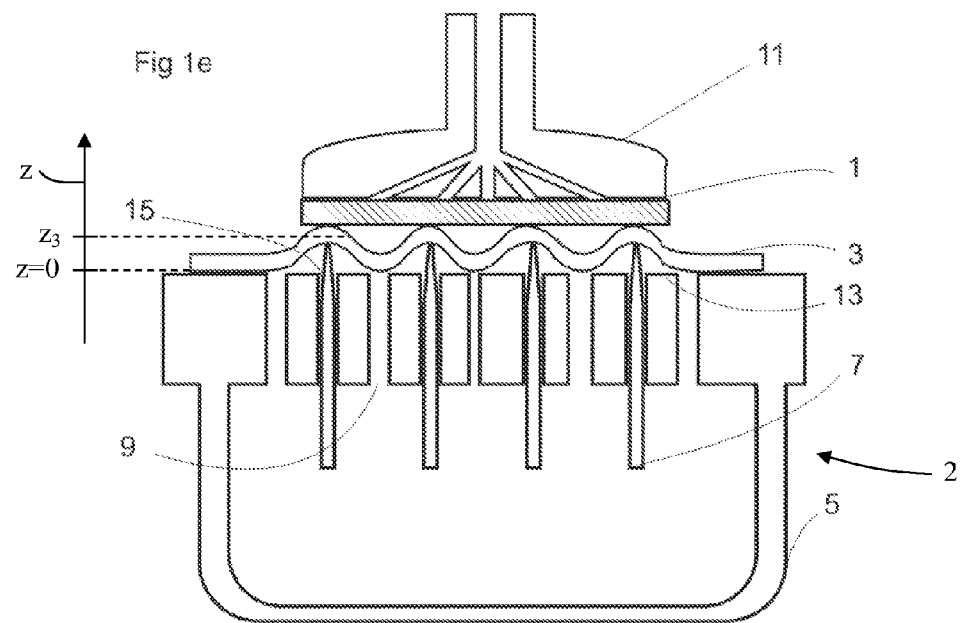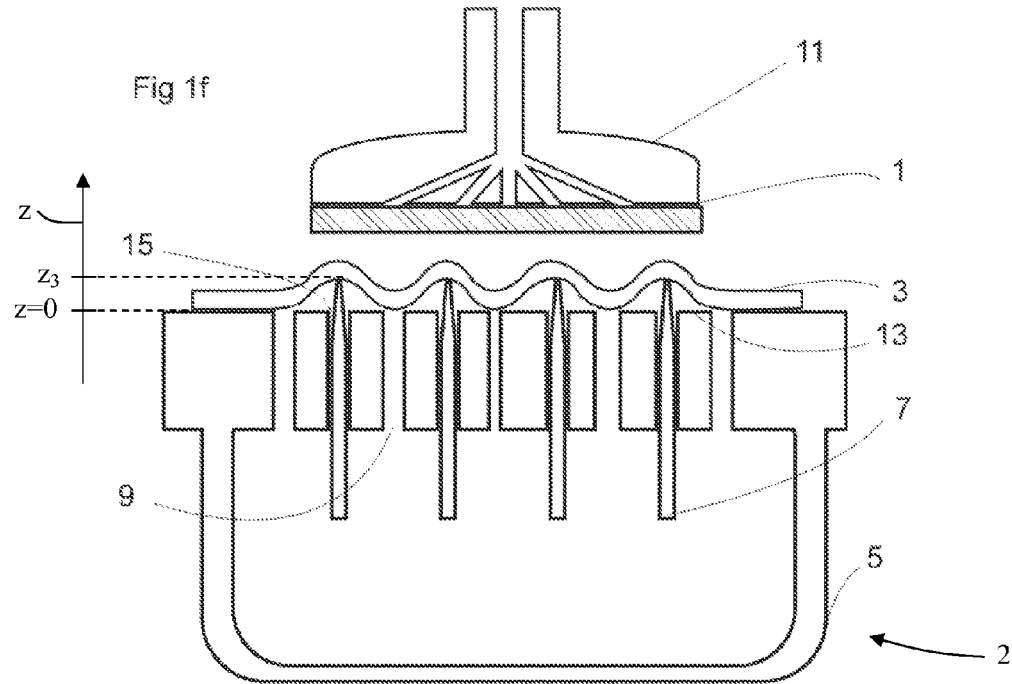

METHOD FOR DETACHING AND REMOVING A SEMICONDUCTOR CHIP FROM A FOIL

CROSS-REFERENCE TO RELATED PATENT APPLICATION

The present application is a National Stage Application of International Application No. PCT/EP2009/064535 entitled "METHOD FOR DETACHING AND REMOVING A SEMICONDUCTOR CHIP FROM A TAPE" filed Nov. 3, 2009 which claims the benefit of U.S. Provisional Application No. 61/113,761 entitled "VERFAHREN ZUM ABLOESEN EINES HALBLEITERCHIPS VON EINER KLEBEFOLIE MITTELS CHIPGREIFER" (METHOD FOR DETACHING A SEMICONDUCTOR CHIP FROM AN ADHESIVE FOIL BY MEANS OF A CHIP GRIPPER) filed Nov. 12, 2008, the entireties of which are herein incorporated by reference.

TECHNICAL FIELD

The invention relates to a method for detaching and removing a semiconductor chip from a foil which is supported by mechanical means.

BACKGROUND OF THE INVENTION

The semiconductor chips are typically provided on a foil held in a frame, which is also known as a tape in the field, for the purpose of processing on a semiconductor mounting device. The semiconductor chips adhere to the foil. The frame with the foil is received by a displaceable wafer table. The wafer table is displaced in cycles in order to provide one semiconductor chip after the other at a location and the semiconductor chip which is then provided is received by a chip gripper and placed on a substrate. The removal of the provided semiconductor chip from the foil is supported by a die ejector which is arranged beneath the foil. The die ejector is a table with a supporting surface on which the foil is disposed. The table contains a plurality of holes in order to fix the foil during the detachment process of the semiconductor chip by means of vacuum.

In many cases, one or several needles arranged in the die ejector will support the detachment of the semiconductor chip from the foil. Needle-supported methods are known from a large number of patents, e.g. from US 20040105750 or U.S. Pat. No. 7,265,035. In US 2008086874, the die ejector comprises a block with a plurality of rods which have a flat end and a second block with a plurality of needles, with the needles being arranged between the rods and the surface of the flat end of each rod having a multiple of the cross section of a needle. For the purpose of detaching the semiconductor chip, the block with the rods is lifted at first and the block with the needles is lifted until the needles protrude beyond the rods.

A die ejector with supporting structures is known from WO 2005117072, on which the foil rests during the entire detachment process. The supporting structures are enclosed by rods with a flat end which are displaceable in the direction towards the semiconductor chip as well as in the opposite direction. The supporting structures and the rods can also be formed by a plurality of individual tappet rods which are arranged in the manner of a matrix.

A die ejector is known from US 20050059205 which comprises several plates which are disposed adjacent to one another, and for the purpose of detaching the semiconductor chips are lifted either jointly and then lowered sequentially from the outside to the inside or are lifted from the outside to the inside sequentially in order to form a pyramidal elevation that protrudes beyond the supporting plane.

Various methods are also known in which the semiconductor chip is detached from the foil without the use of a needle. In U.S. Pat. No. 4,921,564, the foil beneath the semiconductor chip is subjected to a vacuum at many individual locations in order to remove the foil at these places from the semiconductor chip. This is also the case in US 20040038498. The chip gripper receives the semiconductor chip only when the detachment process has been completed, which means when the chip ejector is no longer able to continue the detachment process. This method is therefore not suitable for extremely thin semiconductor chips because they would fracture. In EP 1596422, the foil is detached completely from the semiconductor chip by means of a stamp without the assistance of the chip gripper. This method is also not suitable for extremely thin semiconductor chips because they would bend and/or curl up. In US 2002129899 and U.S. Pat. No. 7,238,593, the foil is drawn over the edge of the die ejector and removed thereby. In U.S. Pat. No. 6,561,743, the foil is drawn off in a boundary region of the semiconductor chip by means of vacuum and then displaced relative to the semiconductor chip which is gripped by the chip gripper, with the semiconductor chip being detached from the foil.

The detachment and removal of a semiconductor chip from the foil is known in the field as pick process. A needle-supported standard pick process comprises the following steps:

a) Displacement of the wafer table in order to provide the next semiconductor chip to be received;
b) Fixing of the foil on the chip ejector by means of vacuum;
c) Lowering of the chip gripper until it touches the surface of the semiconductor chip and applying a vacuum to the chip gripper in order to fix the semiconductor chip;
d) Lifting the needles to a predetermined height, with the needles lifting the semiconductor chip and the foil partly detaching from the semiconductor chip;
e) Moving the chip gripper away, with the semiconductor chip detaching completely from the foil and the needles.

The detachment and removal of semiconductor chips from the foil can only be achieved when the adhesive force of the foil remaining after step d) is smaller than the vacuum suction force of the chip gripper. Otherwise, so-called pick errors occur. The semiconductor chip cannot be picked up and very thin semiconductor chips are damaged or broken.

The semiconductor chip is glued together with the substrate during bonding either by means of an adhesive which was applied first to the substrate, or by means of an adhesive film, a so-called "die attach film", which is applied to its rear side. In the latter case, the semiconductor chip needs to be severed from the foil with the adhesive film. The substrate is heated up to a temperature which is over room temperature in order to produce a permanent adhesive bond between the semiconductor chip and the substrate during bonding. As a result of its contact with the substrate, the adhesive film will melt and tightly glue the semiconductor chip. The chip gripper is heated by this adhesive process that lasts a few seconds. During the next pick process, an undesirable heating of the adhesive film occurs already in the next semiconductor chip to be received during the detachment process. The adhesive force between the foil and the adhesive film will increased, leading to the pick errors as mentioned above.

The term semiconductor chip shall also be understood below as a semiconductor chip whose rear side is coated with an adhesive film.

SHORT DESCRIPTION OF THE INVENTION

It would therefore be desirable to have a method which allows removing the semiconductor chips, in particular also very thin semiconductor chips with a thickness of less than 50 μm, in the shortest possible time from the foil, so that the heating of the semiconductor chip which is caused during the short contact period by the chip gripper will amplify the adhesive bond between the foil and the semiconductor chip only insubstantially.

The invention is based on the finding that this can be achieved when the bonding between the semiconductor chip (or the adhesive film) and the foil is reduced to such an extent that even in the case of a rapid detachment of the semiconductor chip from the foil the forces that arise as a result of the adhesive bond remain non-critical. It needs to be noted that an adhesive film whose adhesive bond is weak right from the beginning cannot be used because this leads to the likelihood that the semiconductor chips will detach in an uncontrollable manner from the foil already during the separation of the wafer into the individual semiconductor chips (during sawing) or during the transport of the sawed wafer.

The invention therefore proposes to cause in a first phase a weakening of the adhesive bond by partial detachment of the foil from the semiconductor chip by mechanical means before the chip gripper is in contact with the semiconductor chip and fixes the semiconductor chip, to bring the chip gripper in a second phase into contact with the semiconductor chip and to tightly hold the semiconductor chip and then to further remove the foil from the semiconductor chip with support by the chip gripper, and to move away the chip gripper with the semiconductor chip in a third phase.

The method for detecting and removing a semiconductor chip from a foil is supported by a chip ejector. The chip ejector has a supporting surface on which the foil rests. The method according to the invention comprises a first phase without any participation of the chip gripper with the following steps:

providing the next semiconductor chip to be removed the support surface of the chip ejector;

supplying a vacuum to the chip ejector in order to tightly hold the foil on the chip ejector;

partial detachment of the foil from the provided semiconductor chip with mechanical means, and recording a picture of the semiconductor chip and determining its position or deviation of its actual position from its target position;

The method in accordance with the invention comprises a second phase with the steps:

lowering the chip gripper until the chip gripper touches the surface of the semiconductor chip;

supplying a vacuum to the chip gripper in order to tightly hold the semiconductor chip;

further detachment of the foil from the provided semiconductor chip;

and a third phase with the step:

lifting and moving the chip gripper away.

The method in accordance with the invention was especially developed for very thin semiconductor chips with thicknesses of less than 50 μm. In the first phase, the foil is detached partly, which means the foil no longer touches the bottom side of the semiconductor chip over a certain percentage of the surface area of the bottom side. At the end of the first phase, the semiconductor chip is held by the foil to such an extent that firstly it is bent or curved at most to the extent that the camera is able to take a picture of the semiconductor chip that can be evaluated, and secondly cannot yet be lifted by the chip gripper from the foil without further support of the chip ejector without damaging or destroying the semiconductor chip. In the second phase, the foil is detached further, which means the percentage of the surface of the bottom side on which the foil does no more touch the bottom side is enlarged. Since the chip gripper already holds the semiconductor chip, the semiconductor chip does not bend in this phase. At the end of the second phase, the foil is either completely detached from the semiconductor chip or it touches the semiconductor chip only over a small percentage of the surface of the bottom side, which surface area is so small that the chip gripper can be lifted in the third phase and can move away while taking the semiconductor chip with it without any likelihood of damage to the same.

Said partial detachment of the semiconductor chip from the foil in the first phase occurs preferably by displacement of a carriage in such a way that a gap is formed in the support surface of the chip ejector beneath one edge of the provided semiconductor chip, with the vacuum prevailing in the gap drawing the foil into the gap and detaching the same from the semiconductor chip. The further detachment in the second phase occurs by further widening of the gap.

The detachment of the semiconductor chip from the foil may be supported with needles which are displaceable in a perpendicular or oblique direction in relation to the support surface. The distance by which the tips of the needles protrude beyond the support surface is designated as height. Said partial detachment of the foil from the provided semiconductor chip occurs in this case by the steps:

lifting the needles to a predetermined height $z_1$, so that the needles protrude beyond the support surface, and lowering the needles to a predetermined height $z_2$ which is smaller than the height $z_1$.

The weakening of the adhesive bond can also occur, alone or in a supporting manner, by cooling the foil from below by means of a fluid such as a cold gas or a cooling fluid.

DESCRIPTION OF THE DRAWING FIGURES

Embodiments of the invention are subsequently explained by means of the drawing. The illustration of the figures is schematically and not to scale.

Figure 3:
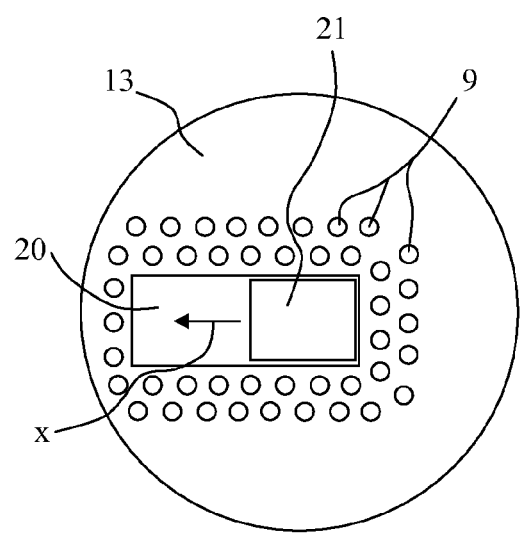

FIGS. 1a-g show various snapshots during the pick process according to a first embodiment in accordance with the invention;

FIGS. 2a-f show various snapshots during the pick process according to a second embodiment in accordance with the invention, and FIG. 3 shows a top view of a chip ejector suitable for the second embodiment.

DETAILED DESCRIPTION OF THE INVENTION

FIGS. 1a to 1g show the parts of a mounting machine involved in the detachment and removal of a semiconductor chip 1 from a foil 3, which are a chip ejector 2 and a chip gripper 11, and the foil 3 and the semiconductor chip 1 at successive points in time during the pick process according to the invention in a first embodiment. The involved parts are simplified and only shown to the extent as is necessary for understanding the pick process. The chip ejector 2 comprises a chamber 5 which can be subjected to a vacuum and comprises an exchangeable cover with a supporting surface 13 on which the foil 3 rests. The cover contains a plurality of holes 9 and 15. The diameter of the holes 9 is preferably only so large that the foil 3 cannot be pulled into the holes 9, which means the holes 9 are substantially only used to hold the foil 3. Needles 7 are arranged in the holes 15 which are usually displaceable in a perpendicular or oblique direction in relation to the supporting surface 13 of the cover. The direction in which the needles 7 are displaceable is designated as the z-direction, with the supporting surface 13 of the cover defining the zero point z=0. The distance by which the needles protrude beyond the supporting surface 13 is designated as height of the needles 7. A negative z-value means that the needles are sunk completely in the holes 15 and do therefore not protrude beyond the supporting surface 13.

The detachment and removal of the semiconductor chip 1 from the foil 3 is extended in accordance with the invention by a preparation phase, so that the entire process comprises three phases. The first phase is the preparation phase in which the adhesive bond between the semiconductor chip 1 and the foil 3 is weakened with the help of the needles 3. The chip gripper 11 is not involved in the first phase. The second phase is an immediately following phase in which the chip gripper 11 supports the further detachment with the aid of the needles 7. In the third phase the chip gripper 11 is lifted and moved away with the semiconductor chip 1 being completely removed from the foil 3 without further support by the needles 11.

The first phase comprises the following steps:

A) Displacing the wafer table in order to provide the next semiconductor chip 1 to be removed above the chip ejector 2;

The needles 7 are in a lowered state within the holes 15, so that they do not touch the foil 3 during step A.

B) Supplying vacuum (or negative pressure) to the chip ejector 2 in order to tightly hold the foil 3 on the chip ejector 2;

In this step, the chamber 5 is subjected to vacuum. The vacuum prevailing in the holes 9 will suck on the foil 3. FIG. 1a shows the state after this step.

C) Lifting the needles 7 to a predetermined height $z_1$.

Figure 1B:
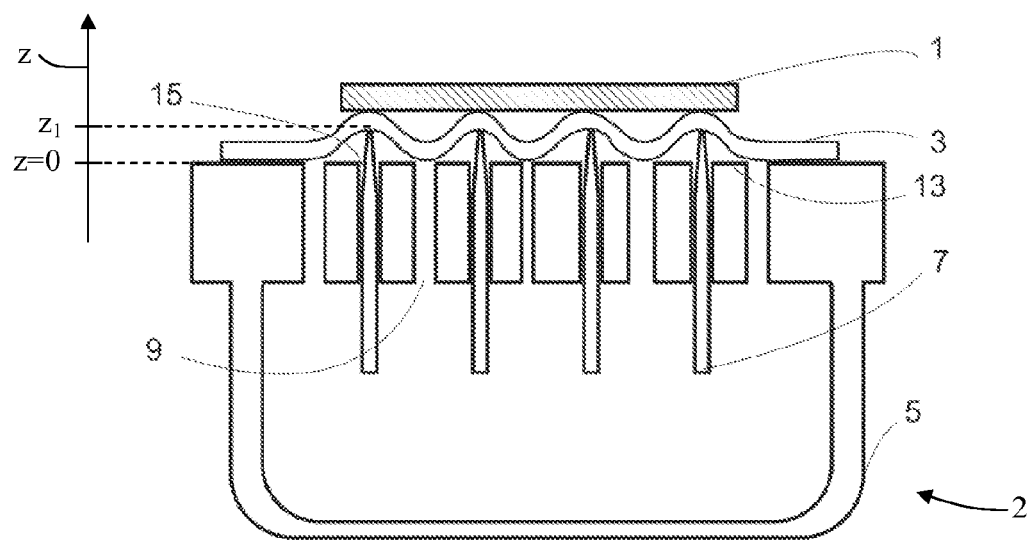

The height $z_1$ has a value $z_1>0$, which means the needles 7 protrude beyond the supporting surface 13. A typical value of $z_1$ is 0.5 mm. In this step, the regions of the foil 3 which lie above the needles 7 are lifted by the chip ejector 2. The semiconductor chip 1 is thus also lifted, whereas the regions of the foil 3 which lie above the holes 9 without needles 7 will remain further on the chip ejector 2 and will thus detach from the semiconductor chip 1. This state is shown in FIG. 1b.

D) Lowering the needles 7 to a predetermined height $z_2$.

After the expiration of a predetermined period of time which typically lies between 0.5 and 3 seconds, the needles 7 are retracted to a predetermined height $z_2$ with $z_2<z_1$. As a consequence, some regions of the foil 3 are still glued to the semiconductor chip 1, whereas other regions have already been detached from the semiconductor 1. This state is shown in FIG. 1c for illustration in an exaggerated manner, with $z_2<0$ in this example. The question whether $z_2<0$ or $z_2=0$ is irrelevant. FIG. 1c further shows the chip gripper 11 which approaches only now.

The lowering of the needles 7 occurs in order that a camera can measure the position of the semiconductor chip 1. Measurements taken with extended needles 7 are often problematic because the chip surface is then partially slightly curved and is not recognized in the image processing in the case of light impinging in a perpendicular way. When the needles 7 are retracted completely into the holes 15 again, the problem may occur again that the semiconductor chip 1 will adhere tightly to the foil 3. In order to avoid this it is advantageous to choose a height $z_2>0$, so that the tips of the needles 7 are disposed slightly above the supporting surface 13, so that the camera will still recognize the semiconductor chip 1 and, despite this, the semiconductor chip 1 will not tightly adhere again to the entire foil 3. Advantages values of $z_2$ lie in the range of 0.0 to 0.2 mm. It needs to be noted that the travel speed of the needles can be chosen between 1 and 10 mm/s E) Recording an image of the semiconductor chip 1 and determining its position or deviation of its actual position from its target position.

This completes the first phase and thus the preparation for the removal of the semiconductor chip 1. It is exceptionally advantageous that for these preparatory steps the chip gripper 11 is not required, which means that the preparation can occur while the bonding head itself is still dealing with the processing (bonding process) of the previously removed semiconductor chip. This preparation may take a correspondingly long time without the overall process time being extended. Moreover, all of this occurs at room temperature, so that during partial detachment of the semiconductor chip 1 from the foil 3 no complications from increased temperature need to be expected.

The second phase now starts with the following steps:

F) Lowering the chip gripper 11 until it touches the surface of the semiconductor chip 1 and applying a vacuum to the chip gripper 11 in order to tightly hold the semiconductor chip 1;

This state is shown in FIG. 1d.

G) Lifting the needles 7 to a predetermined height $z_3$.

In this step, the needles 7 lift the semiconductor chip 1 again or further, and the foil 3 detaches further from the semiconductor chip 1. A typical value for $z_3$ lies at 0.5 mm. The state after this step is shown in FIG. 1e. In this step the areas are enlarged where the foil 3 no longer touches the bottom side of the semiconductor chip 1. (This can hardly be seen in the drawings).

Now the third phase starts with the step:

H) Lifting and moving the chip gripper 11 away.

In this step, the semiconductor chip 1 detaches completely from the foil 3 and the needles 7.

Since due to the preparatory steps A to C many regions of the semiconductor chip 1 have been detached from the foil 3, the chip gripper 11 in collaboration with the needles 11 of the chip ejector 2 now easily manages to detach and completely remove the semiconductor chip 1 from the foil 3 with high speed and without further problems. The duration of the chip removal process, which means the time which is required for steps F to H (until the semiconductor chip 1 is no longer in contact with the foil 3), is thus reduced from typically 1 second when there is no preparation by steps A to C of the first phase to 0.1 seconds.

FIG. 1f shows a snapshot of when the chip gripper 11 with the received semiconductor chip 1 has already moved slightly from the foil 3. As is illustrated, the needles 7 are only moved beneath the supporting surface 13 when the chip gripper 11 has completely detached the semiconductor chip 1 from the foil 3.

Figure 1G:
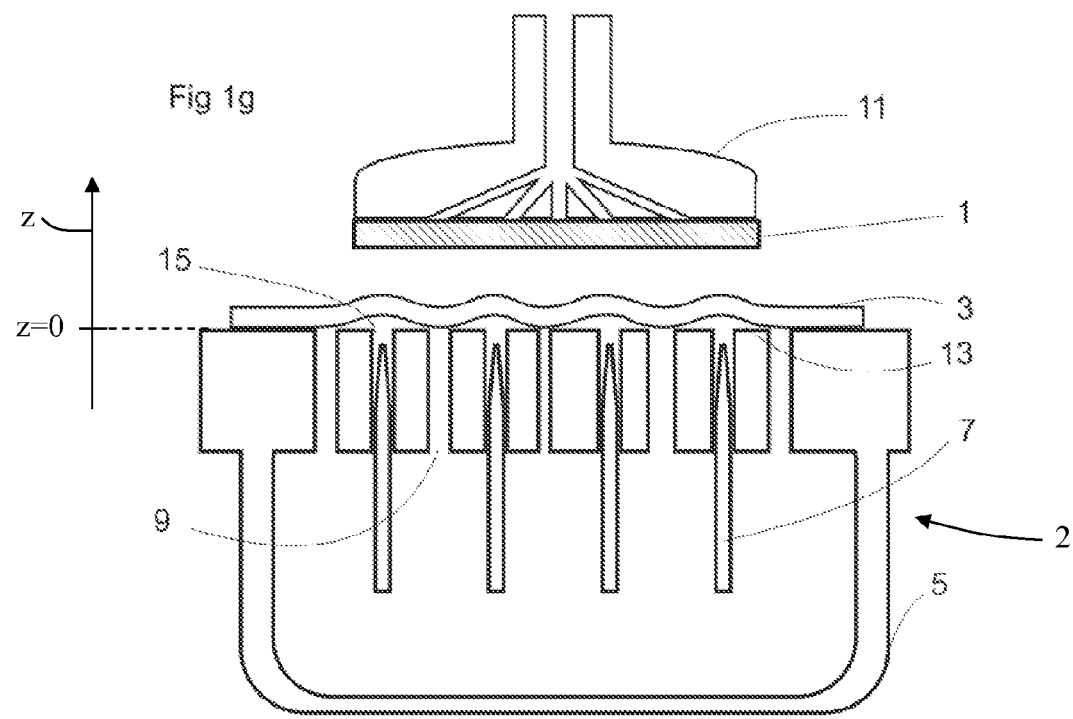

FIG. 1g shows a last snapshot after the needles 7 have been lowered again to a height z<0, so that the pick process of the next semiconductor chip can be started. Whereas the chip gripper 11 further processes the semiconductor chip that was just removed, the first phase of the next semiconductor chip to be removed can already be started.

The removal of the semiconductor chip 1 can also be performed with other steps instead of the described method steps F to H, which other steps are adjusted to the respective problem to be solved and as are known from the state of the art. It is relevant within the scope of the present invention that the actual phase of the chip removal was preceded by a first, preparatory phase for at least partly detaching the semiconductor chip 1 from the foil 3 without any participation of the chip gripper 11, and a second phase for further detaching the semiconductor chip 1 from the foil with participation of the chip gripper 11 and further support by the needles 11 of the chip ejector 2.

FIGS. 2a to 2g show the parts of a mounting machine involved in the detachment and removal of a semiconductor chip 1 from a foil 3 at successive points in time during the pick process in accordance with the invention in a second embodiment. The involved parts are only shown in a simplified way and only to the extent as is required for understanding the pick process. The chip ejector 2 again comprises the chamber 5 which can be subjected to vacuum and which comprises the cover with the supporting surface 13 on which the foil 3 is placed. The supporting surface 13 contains an opening 20 which is rectangular for example and a plurality of holes 9 which enclose the opening 20 on at least three sides. A carriage 21 is arranged in the opening 20, which carriage is displaceable parallel to the supporting surface 13 of the cover. The direction of displacement of the carriage 21 is designated as the x-direction. In the direction of displacement, the length of the carriage 21 is approximately as large as the length of the semiconductor chip 1, the length of the opening 20 is at least twice as large as the length of the semiconductor chip 1. FIG. 3 shows the chip ejector 2 in a top view.

The detachment and removal of the semiconductor chip 1 from the foil 3 comprises a first preparatory phase, in which the adhesive bond between the semiconductor chip 1 and the foil 3 is weakened with the help of the carriage 21, but without any participation of the chip gripper 11. The second phase is a directly following phase in which the chip gripper 11 further detaches the semiconductor chip 1 from the foil 3 with further support by the chip ejector 2.

The first phase comprises the following steps:

A) Displacing the wafer table in order to provide the next semiconductor chip 1 to be removed above the chip ejector 2;

The carriage 21 was previously placed in the opening 20 in such a way that it is located beneath the provided semiconductor chip 1.

Figure 2A:
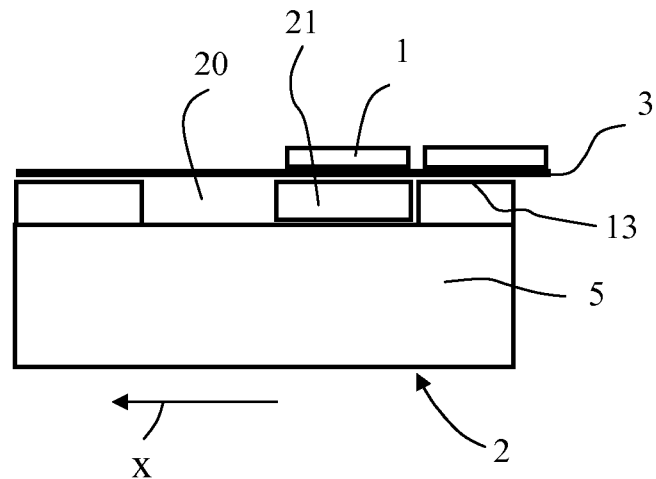

B) Subjecting the chip ejector 2 with vacuum (or negative pressure) in order to tightly hold the foil 3 on the chip ejector 2;

The vacuum prevailing in the holes 9 (FIG. 3) sucks up the foil 3. FIG. 2a shows the state after this step. (The carriage 21 is located in this example at the right edge of the opening 20.)

C) Displacing the carriage 21 in the direction of displacement by a predetermined distance $D_1$.

Figure 2B:
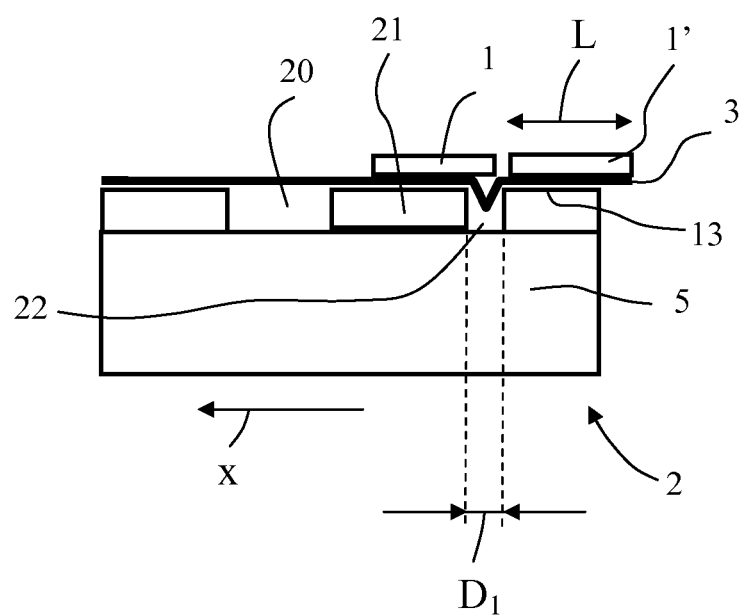

(The carriage 21 moves in this example to the left.) The reached state is shown in FIG. 2b. The displacement of the carriage 21 occurs at a comparatively slow speed which is typically approx. 2 to 5 mm/s. A gap 22 of increasing size is obtained in this step between the supporting surface 13 and the carriage 21. The vacuum prevailing in the chamber 5 draws the foil 3 into the gap 22, with the foil 3 detaching from the semiconductor chip 1 in this area. Distance $D_1$ is typically approximately 10% to 20% of the length L of the semiconductor chips 1, 1'. This step ensures that the foil 3 is detached from the semiconductor chip 1 in the region of an edge of the semiconductor chip 1. This step needs to occur very carefully, which is why the speed of the carriage 21 is comparatively small. This step therefore requires some time. Once the foil has been detached in a boundary region of approx. 10% to 20% of the length L of the semiconductor chip 1, it can be withdrawn at a comparatively high speed from the rest of the semiconductor chip 1. This occurs only in the second phase when the chip gripper 11 supports the detachment.

D) Recording an image of the semiconductor chip 1 and determining its position or deviation of its actual position from its target position.

This completes the first phase and thus the preparation of removing the semiconductor chip 1. The second phase starts now with the following steps:

E) Lowering the chip gripper 11 until it touches the surface of the semiconductor chip 1 and applying vacuum to the chip gripper 11 in order to tightly hold the semiconductor chip 1.

Figure 2C:
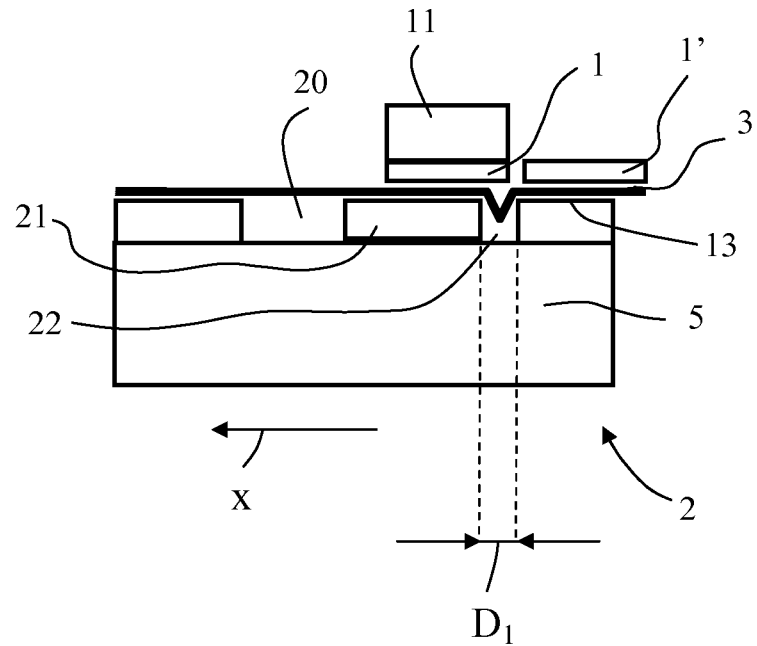

This state is shown in FIG. 2c.

F) Further displacement of the carriage 21 in the same direction as in step C.

Figure 2D:
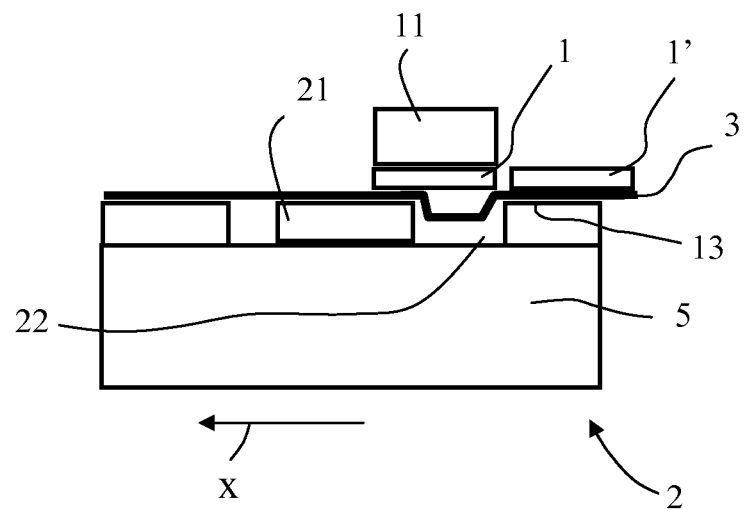
Figure 2E:
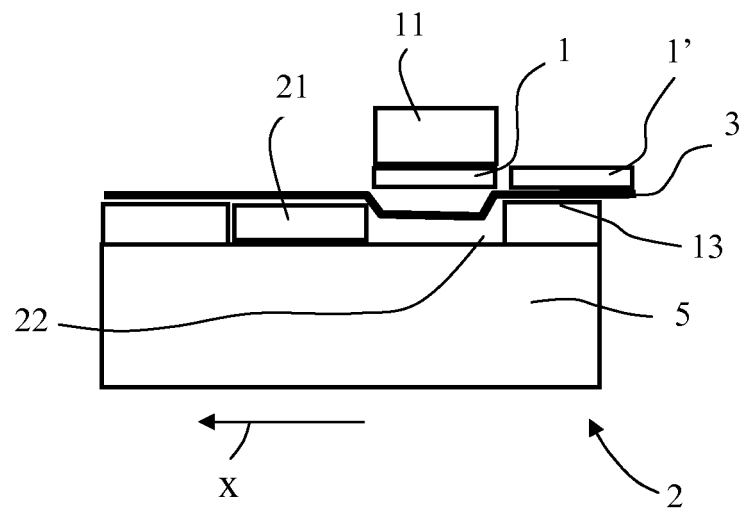

Since the foil 3 has already been detached from one edge of the semiconductor chip 1 at the beginning of this step, the displacement of carriage 21 can occur at a comparatively high speed. It is typically approximately 20 mm/s, but it is not limited to this value. In this step, the foil 3 detaches further from the semiconductor chip 1 due to the vacuum prevailing in the chamber 5 and in gap 22. FIG. 2d shows a snapshot of this step F. FIG. 2e shows a snapshot at the end of step F. The semiconductor chip 1 has now been completely detached from the foil 3.

Now the third phase follows with the step:

G) Lifting and moving away the chip gripper 11.

Figure 2F:
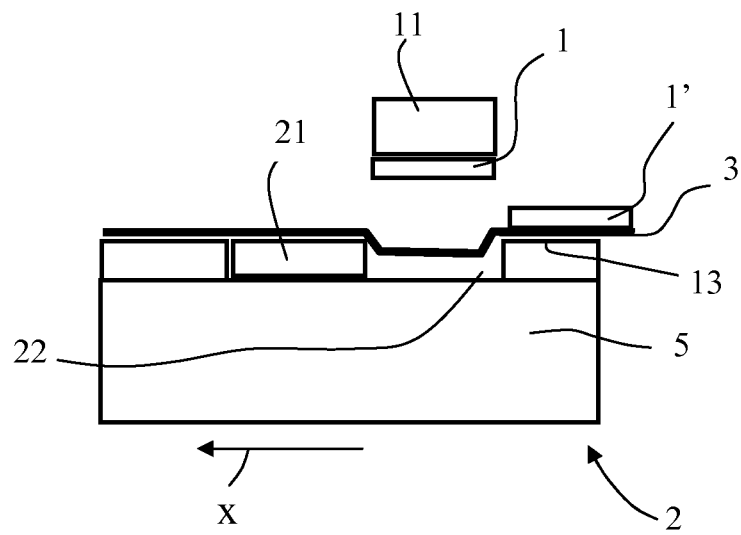

FIG. 2f shows a snapshot during this step.

The detachment of the semiconductor chip 1 from the foil 3 can also be performed with one of the devices of US 20050059205, wherein the chip gripper 11 does not participate in the first phase and wherein the chip ejector 2 in the second phase further detaches the foil 3 from the semiconductor chip 11 while the semiconductor chip 1 is held by the chip gripper 11, before in the third phase the chip gripper 11 is lifted and moved away taking the semiconductor chip 1 with it.

The described methods in accordance with the invention are suitable for semiconductor chips whose rear side has been coated with an adhesive film, as well as for comparatively large semiconductor chips whose edge lengths are larger than 10 mm and which are glued to the substrate with an adhesive material applied to the substrate. In this case too, the weakening of the adhesive bond in the first phase leads to a reduction in the process time for the removal of the semiconductor chips, because the chip gripper needs to provide support only during a very short period of time. The detachment of the semiconductor chip from the foil can already occur at a time due to the invention when the chip gripper still needs to deal with the bonding of the preceding semiconductor chip.

The described embodiments contain only the most important steps. These steps can comprise further sub-steps or can be performed within the respective phase in another sequence. The step of taking a picture of the semiconductor chip and determining its position or deviation of its actual position from its target position can also be performed before the semiconductor chip has partly been detached from the foil, namely then when its position will not change as a result of the further detachment.

The partial detachment of the semiconductor chip from the foil can also occur with mechanical means other than described herein.

The invention claimed is:

1. A method for detaching and removing a semiconductor chip from a foil, in which a chip ejector supports the detachment of the semiconductor chip from the foil and a chip gripper takes up the semiconductor chip, with the chip ejector having a support surface on which the foil rests, the method comprising a first phase without any participation of the chip gripper, a subsequent second phase and a subsequent third phase, the first phase comprising the steps:

providing the next semiconductor chip to be removed on the support surface of the chip ejector at a position, where the semiconductor chip will be grasped by the chip gripper in the second phase, the semiconductor chip still completely adhering to the foil; and then supplying a vacuum to the chip ejector in order to tightly hold the foil on the chip ejector; and then weakening of an adhesive bond between the semiconductor chip and the foil by partially detaching the foil from the provided semiconductor chip with mechanical means, wherein at the end of the weakening, the semiconductor chip is held by the foil to such an extent that firstly the semiconductor chip is bent or curved at most to the extent that a camera is able to take a picture of the semiconductor chip that can be evaluated and that secondly the semiconductor chip cannot yet be lifted by the chip gripper from the foil without damaging or destroying the semiconductor chip, and then taking a picture of the semiconductor chip and determining its position or deviation of its actual position from its target position, respectively;

the second phase comprising the steps:

lowering the chip gripper until the chip gripper touches the surface of the semiconductor chip;

supplying a vacuum to the chip gripper in order to tightly hold the semiconductor chip; and then further detaching the foil from the provided semiconductor chip with support by the chip ejector, wherein at the end of the second phase, the foil is either completely detached from the semiconductor chip or the foil touches the semiconductor chip only over a small percentage of the surface of a bottom side; and the third phase comprising the step:

lifting and moving the chip gripper away from the foil.

2. The method of claim 1, said partially detaching of the foil from the semiconductor chip occurring by displacing a carriage, so that a gap is formed in the support surface of the chip ejector beneath one edge of the provided semiconductor chip, with the vacuum prevailing in the gap drawing the foil into the gap and detaching the same from the semiconductor chip, wherein at the end of the partially detaching the foil has been detached in a boundary region of approximately 10% to 20% of a length of the semiconductor chip.

3. The method of claim 1, wherein the detachment of the semiconductor chip from the foil is supported with needles which are displaceable in a perpendicular or oblique direction in relation to the support surface and with a distance by which the tips of the needles protrude beyond the support surface being designated as height, the method further comprising the following steps to perform said partially detaching of the foil from the provided semiconductor chip:

lifting the needles to a predetermined height $z_1$, so that the needles protrude beyond the support surface, and lowering the needles to a predetermined height $z_2$ which is smaller than the height $z_1$.

4. The method of claim 3, further comprising choosing the height $z_2$ in such a way that the needles do not protrude beyond the support surface.

* * * * *